United States Patent
Murakami

(10) Patent No.: US 12,133,335 B2
(45) Date of Patent: Oct. 29, 2024

(54) MOUNTING HEAD MAINTENANCE DEVICE

(71) Applicant: FUJI CORPORATION, Chiryu (JP)

(72) Inventor: Motokazu Murakami

(73) Assignee: FUJI CORPORATION, Chiryu (JP)

( * ) Notice: Subject to any disclaimer, the term of this patent is extended or adjusted under 35 U.S.C. 154(b) by 481 days.

(21) Appl. No.: 17/436,733

(22) PCT Filed: Mar. 18, 2019

(86) PCT No.: PCT/JP2019/011250
§ 371 (c)(1),
(2) Date: Sep. 7, 2021

(87) PCT Pub. No.: WO2020/188712
PCT Pub. Date: Sep. 24, 2020

(65) Prior Publication Data
US 2022/0142029 A1    May 5, 2022

(51) Int. Cl.
*H05K 13/08* (2006.01)
*H05K 13/04* (2006.01)

(52) U.S. Cl.
CPC ..... *H05K 13/0895* (2018.08); *H05K 13/0409* (2018.08)

(58) Field of Classification Search
None
See application file for complete search history.

(56) References Cited

U.S. PATENT DOCUMENTS 6,076,394 A * 6/2000 Tsuda ................. H05K 13/0409
294/185
2019/0024813 A1    1/2019 Ito

FOREIGN PATENT DOCUMENTS

| JP | 11-340689 A | 12/1999 | |
| WO | WO-2013057843 A1 * | 4/2013 | ......... H05K 13/0409 |
| WO | WO 2013/153598 A1 | 10/2013 | |
| WO | WO 2017/126031 A1 | 7/2017 | |
| WO | WO 2018/179300 A1 | 10/2018 | |

OTHER PUBLICATIONS

International Search Report mailed on Jun. 4, 2019 in PCT/JP2019/011250 filed on Mar. 18, 2019 (1 page).

* cited by examiner

*Primary Examiner* — Matthew G Marini
(74) *Attorney, Agent, or Firm* — Oblon, McClelland, Maier & Neustadt, L.L.P.

(57) ABSTRACT

A mounting head maintenance device includes an external flow path to communicate with an internal flow path of a mounting head, the mounting head having a nozzle holding section that detachably holds a suction nozzle, the internal flow path that selectively supplies negative pressure air and positive pressure air to the held suction nozzle, and an internal air sensor that is provided in the internal flow path and detects at least one of a flow rate and pressure of the air, a reference air sensor in the external flow path and configured to detect at least one of the flow rate and the pressure of the air, and a detection result acquiring section to acquire an internal detection result of the internal air sensor and a reference detection result of the reference air sensor which can be compared with the internal detection result in association with each other.

6 Claims, 12 Drawing Sheets

MOUNTING HEAD MAINTENANCE DEVICE

TECHNICAL FIELD

The present specification relates to a device for maintaining a mounting head having a suction nozzle and detachably attached on a component mounter.

BACKGROUND ART

A technique for mass-producing a circuit board by performing a board work on a board on which printed wiring is applied has become widespread. A typical example of a board work machine for performing the board work is a component mounter that performs a component mounting work. In many component mounters, the mounting head having the suction nozzle is detachably attached. The mounting head has an internal flow path that selectively supplies negative pressure air and positive pressure air to the suction nozzle. In a negative pressure flow path range in which the negative pressure air flows in the internal flow path, dust or the like may be mixed in accordance with a suction of an outside air, so that there is a concern that a function of the suction nozzle is decreased. As a measure against this, for example, the maintenance of the mounting head is performed by the device disclosed in Patent Literature 1.

A mounting head cleaning device of Patent Literature 1 is a maintenance device that supplies a positive pressure air to an internal flow path to clean the inside of the mounting head. The mounting head cleaning device includes a head clamping device common to the component mounter, switching means for selectively supplying a positive pressure air supplied from an air supply source to a cleaning passage or an inspection passage, and air measuring means provided in an inspection passage. According to this, it is said that the inside of the mounting head can be automatically cleaned, and further, the flow of air can be measured after the cleaning.

PATENT LITERATURE

Patent Literature 1: WO 2013/153598

BRIEF SUMMARY

Technical Problem

In the device disclosed in Patent Literature 1, it is preferable that the cleaning of the mounting head and the measurement of the flow of air can be automated. However, many mounting heads have an internal air sensor in an internal flow path, the internal air sensor detecting at least one of the flow rate and the pressure of the air. In a case where a detection accuracy of the internal air sensor decreases, even when the internal flow path returns to a good state by the cleaning, a good function of the suction nozzle is not guaranteed.

An object of the present specification is to provide a mounting head maintenance device capable of calibrating an internal air sensor.

Solution to Problem

The present specification describes a mounting head maintenance device including an external flow path configured to communicate with an internal flow path of a mounting head, the mounting head having a nozzle holding section that detachably holds a suction nozzle, the internal flow path that selectively supplies negative pressure air and positive pressure air to the held suction nozzle, and an internal air sensor that is provided in the internal flow path and detects at least one of a flow rate and pressure of the air, a reference air sensor provided in the external flow path and configured to detect at least one of the flow rate and the pressure of the air, and a detection result acquiring section configured to acquire an internal detection result of the internal air sensor and a reference detection result of the reference air sensor which can be compared with the internal detection result in association with each other.

Advantageous Effects

In the mounting head maintenance device described in the present specification, the detection result acquiring section acquires the internal detection result of the internal air sensor of the mounting head and the reference detection result of the reference air sensor provided in the external flow path outside the mounting head in association with each other. Accordingly, by comparing the two detection results, it is possible to calibrate the internal air sensor. That is, in a case where the two detection results coincide with each other, it is guaranteed that the detection accuracy of the internal air sensor is correct. In addition, in a case where the two detection results do not coincide with each other, the internal air sensor can be calibrated to recover the detection accuracy.

DESCRIPTION OF EMBODIMENTS

1. Configuration Example of Component Mounter 1

Figure 1:
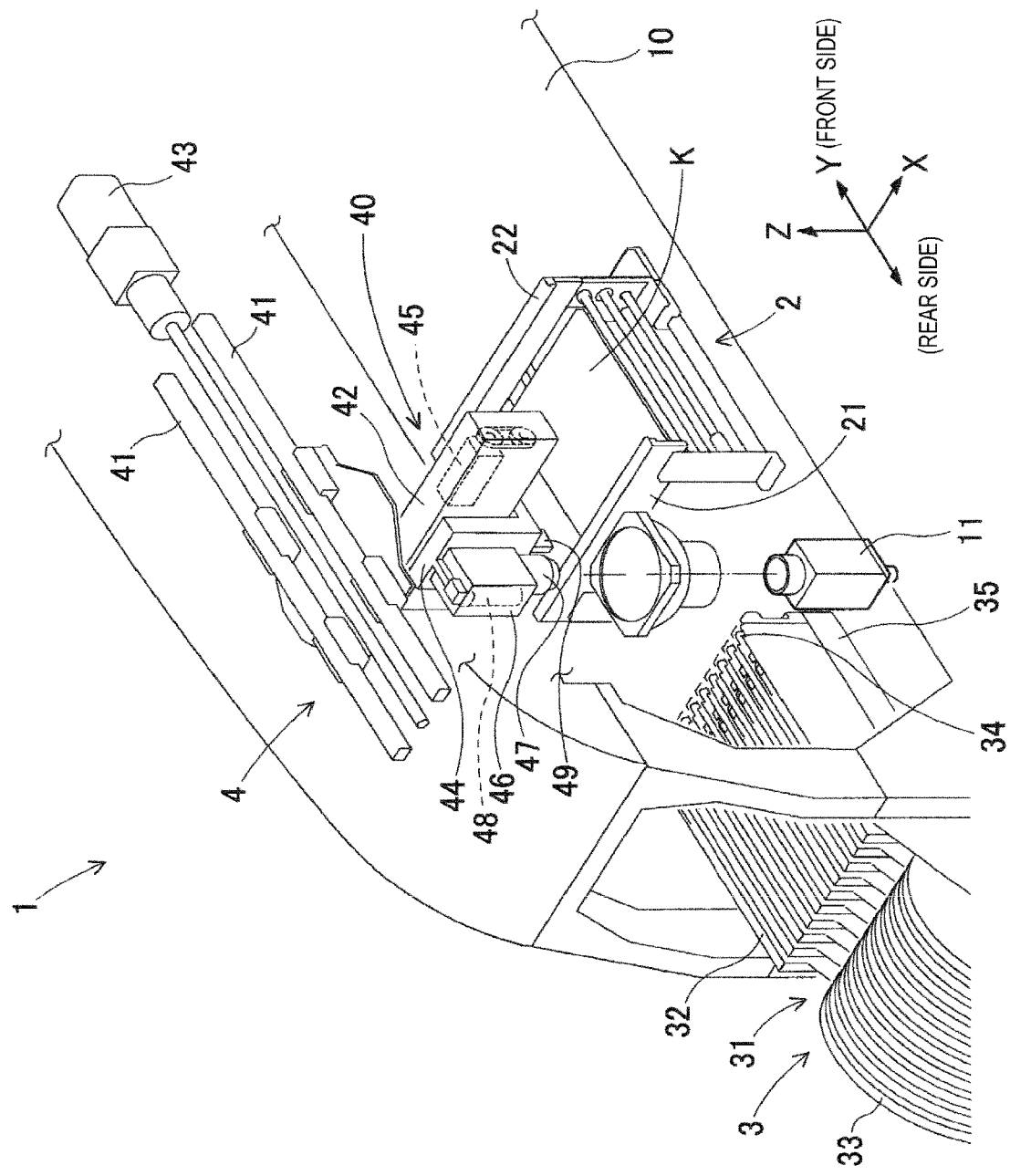
FIG. 1 is a perspective view showing a configuration example of a component mounter to which a mounting head is attached.

First, a configuration example of component mounter 1 to which mounting head 46 is attached will be described with reference to FIG. 1 to FIG. 4. In FIG. 1, a direction directed from a top-left to a bottom right is denoted by an X-axis direction in which board K is conveyed, a direction directed from a bottom left (a rear side) to a top-right (a front side) is denoted by a Y-axis direction, and a vertical direction is denoted by a Z-axis direction. Component mounter 1 performs component mounting work repeatedly. Component mounter 1 includes board conveyance device 2, component supply device 3, component transfer device 4, part camera 11, a control device (not illustrated), and the like.

Board conveyance device 2 is configured with first guide rail 21 and second guide rail 22, a pair of conveyor belts, a clamping device, and the like. First guide rail 21 and second guide rail 22 extend in the X-axis direction across a center of an upper portion of base 10 and are assembled to base 10 so as to be parallel to each other. A pair of conveyor belts disposed in parallel with each other are provided along first guide rail 21 and second guide rail 22. The pair of conveyor belts rotate with board K placed on conveyor conveyance surfaces thereof and conveys board K in and out of a mounting execution position set at a center of base 10. In addition, the clamping device is provided at the center section of base 10 below the conveyor belts. The clamping device pushes up board K with multiple push-up pins, clamps board K in a horizontal posture, and positions board K in the mounting execution position.

Component supply device 3 is detachably mounted at a rear side of component mounter 1. Component supply device 3 is configured by arranging multiple feeder devices 31 side by side on device pallet 35. Feeder device 31 includes main body 32, supply reel 33 provided at a rear side of main body 32, and component removal section 34 provided at an upper portion of a front end of main body 32. Carrier tape, in which multiple components are sealed in at predetermined pitches, is wound around and held to supply reel 33. When this carrier tape is fed at the predetermined pitches, the components are released from a sealed state and are subsequently fed into component removal section 34.

Component transfer device 4 is configured with a pair of Y-axis rails 41, Y-axis moving body 42, Y-axis motor 43, X-axis moving body 44, X-axis motor 45, mounting head 46, and the like. The pair of Y-axis rails 41 is disposed from the front side to a region above component supply device 3 in the rear side. The Y-axis moving body 42 is loaded on the pair of Y-axis rails 41. Y-axis moving body 42 is driven via a ball screw mechanism by Y-axis motor 43 and moves in the Y-axis direction.

X-axis moving body 44 is loaded on Y-axis moving body 42. X-axis moving body 44 is driven via a ball screw mechanism by X-axis motor 45 and moves in the X-axis direction. Mounting head 46 is detachably attached to a rear side of X-axis moving body 44. Y-axis rails 41, Y-axis moving body 42, Y-axis motor 43, and X-axis motor 45 configure head driving mechanism 40 for driving mounting head 46.

Figure 11:
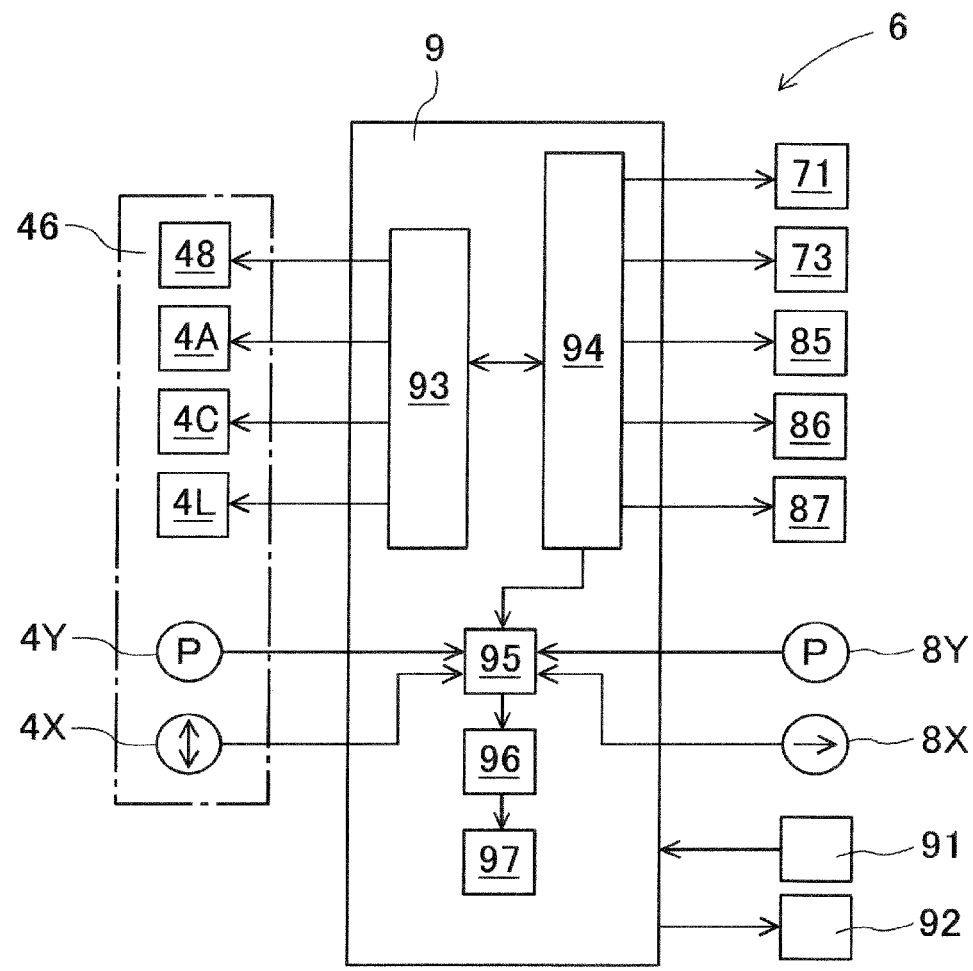
FIG. 11 is a functional block diagram showing a configuration of control of a mounting head maintenance device.

Mounting head 46 has rotary tool 47 at a lower side thereof. Rotary tool 47 is rotationally driven by R-axis motor 4A (refer to FIG. 11). Although not shown in FIG. 1, multiple suction nozzles 5 (refer to FIG. 2) are annularly disposed at a lower side of rotary tool 47. Mark camera 49 is provided at the lower side of mounting head 46 in such a manner as to be disposed side by side with rotary tool 47. Mark camera 49 images a position mark attached to positioned board K to detect an accurate mounting execution position for board K.

Part camera 11 is provided on an upper surface of base 10 between board conveyance device 2 and component supply device 3 while being oriented upwards. Part camera 11 images a state of mounting head 46 which is on its way to board K with multiple suction nozzles 5 having picked up components from component removal section 34. As a result, part camera 11 can collectively image the components each held by multiple suction nozzles 5. The acquired image data is subjected to image processing to confirm the presence or absence of a component and the correctness of the component, and to acquire a suction orientation.

The control device holds job data for each type of board K, and controls a mounting work. The job data is data describing a detailed procedure and method of the mounting work. Control device transmits various commands to board conveyance device 2, component supply device 3, component transfer device 4, and part camera 11. In addition, the control device receives information on an operation status from these devices. The control device may be configured as a single computer device or may be configured as being functionally distributed among multiple computer devices.

2. Configurations of Suction Nozzle 5 and Mounting Head 46

Figure 2:
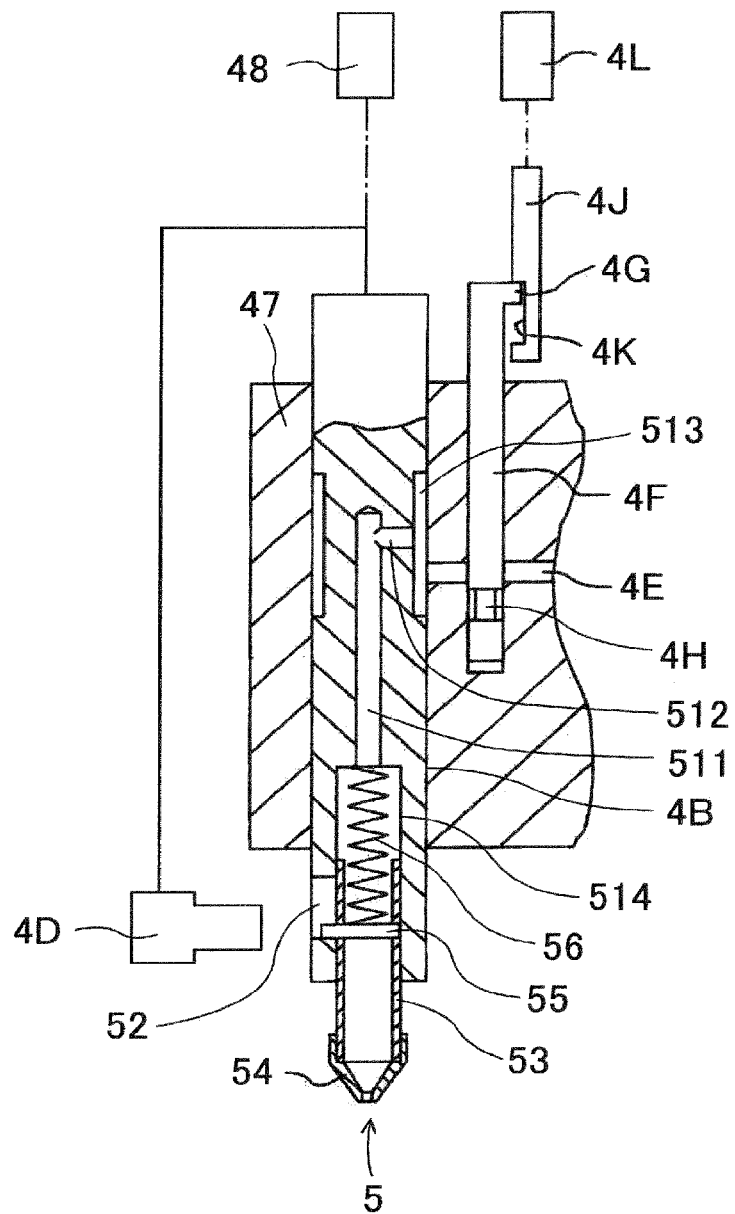
FIG. 2 is a side cross-sectional view showing a configuration around a suction nozzle and a nozzle holding section.

Next, detailed configurations of suction nozzle 5 and mounting head 46 will be described. Multiple nozzle holding sections 4B are provided at equal intervals on a circumference separated from the center of rotary tool 47. As shown in FIG. 2, nozzle holding section 4B is formed by a cylindrical inner space extending in an up-down direction. Nozzle holding section 4B detachably and operatively holds suction nozzle 5.

Suction nozzle 5 is configured with nozzle main body section 51, nozzle tip portion 53, biasing spring 56, and the like. Nozzle main body section 51 is formed to be long in the up-down direction, and is disposed in nozzle holding section 4B so as to be lifted and lowered. An airtight structure is formed between an outer peripheral surface of nozzle main body section 51 and an inner peripheral surface of nozzle holding section 4B. Nozzle main body section 51 has axial direction flow path 511, radial direction flow path 512, outer peripheral flow path 513, and tip holding space 514. Axial direction flow path 511 is formed at a center of nozzle main body section 51 and extends in the up-down direction. Radial direction flow path 512 is formed in a radial direction and communicates from an upper portion of axial direction flow path 511 to an outer peripheral surface of nozzle main body section 51.

Outer peripheral flow path 513 is formed by reducing a diameter of a part of the outer periphery of nozzle main body section 51. Outer peripheral flow path 513 extends in the up-down direction and the circumferential direction in the outer periphery of nozzle main body section 51 while communicating with radial direction flow path 512. Tip holding space 514 is formed by communicating with a lower side of axial direction flow path 511. Tip holding space 514 is a space having a larger diameter than axial direction flow path 511 and is opened downward. Nozzle main body section 51 has elevating regulation window 52 that opens from an inner surface to an outer peripheral surface of tip holding space 514.

Nozzle tip portion 53 is provided inside tip holding space 514 so as to be lifted and lowered while securing airtight. Nozzle tip portion 53 is formed of a cylindrical member, and an outer diameter thereof is substantially equal to an inner diameter of tip holding space 514. Nozzle tip portion 53 has opening portion 54 opened downward at the lower side while being gradually reduced in diameter as going downward. In order to correspond to components of various sizes to be picked up, multiple types of suction nozzle 5 having different opening areas of opening portion 54 are used.

Support plate 55 that does not obstruct the flow of air is provided at a mid-height of nozzle tip portion 53. Support plate 55 is disposed in the horizontal direction, and an end portion thereof engages with elevating regulation window 52. Biasing spring 56 is provided between support plate 55 and nozzle main body section 51. Biasing spring 56 biases nozzle tip portion 53 downward with nozzle main body section 51 as a reference. Accordingly, in a normal state, nozzle tip portion 53 is maintained at a height at which support plate 55 contacts a lower surface of elevating regulation window 52 (refer to FIG. 2).

Here, a nozzle operating position at which suction nozzle 5 operates is set at a specific location closer to a rear portion of mounting head 46. Z-axis motor 48 corresponding to a lifting and lowering drive section is provided above the nozzle operating position. Suction nozzle 5 set to the nozzle operating position by the rotation of rotary tool 47 is driven by Z-axis motor 48 to be lifted and lowered in nozzle holding section 4B. In addition, suction nozzle 5 set to the nozzle operating position is driven by Q-axis motor 4C (refer to FIG. 11) to rotate in nozzle holding section 4B.

Further, touchdown monitoring sensor 4D is provided in the vicinity of the nozzle operating position. Touchdown monitoring sensor 4D monitors a touch-down state in which a lower end of suction nozzle 5 driven to be lowered abuts on an object. As touchdown monitoring sensor 4D, a photoelectric sensor that monitors a height position of support plate 55 using the passage and reflection of detection light can be exemplified. The photoelectric sensor (touchdown monitoring sensor 4D) is driven by Z-axis motor 48 to be lowered together with suction nozzle 5.

A supplementary description will be given of a detection method by the photoelectric sensor (touchdown monitoring sensor 4D). When driven to be lowered by Z-axis motor 48, nozzle main body section 51, nozzle tip portion 53, and the photoelectric sensor are both lowered initially. When nozzle tip portion 53 abuts on the object and cannot be lowered, nozzle main body section 51 and the photoelectric sensor continue to be lowered thereafter. As a result, biasing spring 56 is compressed, so that support plate 55 is separated from the lower surface of elevating regulation window 52. That is, since support plate 55 relatively rises when viewed from the photoelectric sensor, it is possible to detect the touch-down state. As touchdown monitoring sensor 4D, a monitoring means other than the photoelectric sensor, for example, a monitoring camera for imaging the lowering operation of suction nozzle 5 may be used.

In addition, rotary tool 47 is provided with internal flow path 4E and mechanical valve 4F for each suction nozzle 5. Internal flow path 4E selectively supplies negative pressure air and positive pressure air to suction nozzle 5. Internal flow path 4E is formed so as to be opened in nozzle holding section 4B and communicates with outer peripheral flow path 513 of suction nozzle 5. Since outer peripheral flow path 513 expands in the up-down direction and the circumferential direction, the communication between internal flow path 4E and outer peripheral flow path 513 is maintained even when suction nozzle 5 is lifted and lowered or rotated.

Mechanical valve 4F mechanically opens and closes internal flow path 4E. Mechanical valve 4F extends in the up-down direction while shutting off internal flow path 4E, and is provided so as to be lifted and lowered. Mechanical valve 4F has engaging section 4G driven to be lifted and lowered at an upper portion thereof, and has opening portion 4H for communicating internal flow path 4E downward. Mechanical valve 4F includes a frictional force holding mechanism (not shown), so that the influence of gravity, vibration, and the like can be suppressed. As a result, mechanical valve 4F is stably positioned at a lower side in a normal state.

In addition, drive axis 4J and stepping motor 4L are provided in the vicinity of the nozzle operating position of mounting head 46. Driving axis 4J has locking section 4K for locking engaging section 4G of mechanical valve 4F, and is held so as to be lifted and lowered. When rotary tool 47 rotates, locking section 4K of drive axis 4J locks engaging section 4G of another mechanical valve 4F.

Figure 3:
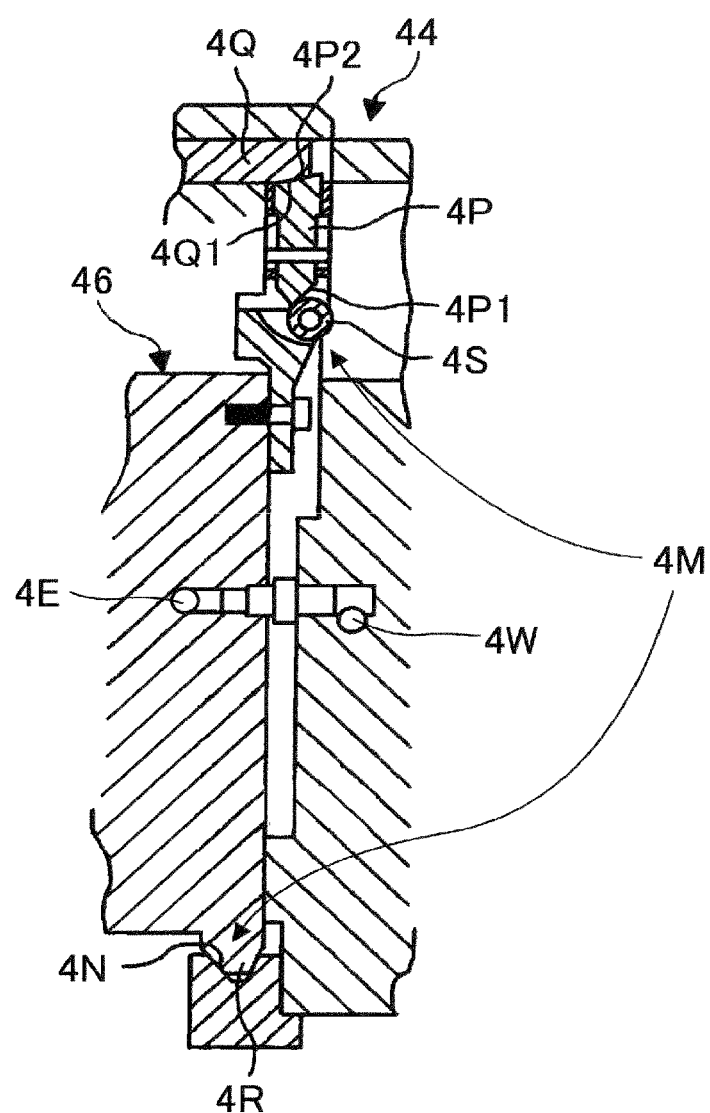
FIG. 3 is a side cross-sectional view showing an attaching structure of a mounting head.

Stepping motor 4L drives drive axis 4J to be lifted and lowered. In FIG. 3, stepping motor 4L is not operating, drive axis 4J is positioned at a lower side, and mechanical valve 4F is positioned at a lower side. At this time, opening portion 4H of mechanical valve 4F is removed from internal flow path 4E, so that internal flow path 4E is shut off. When stepping motor 4L operates to drive drive axis 4J upward, locking section 4K drives engaging section 4G upward, so that mechanical valve 4F rises. As a result, opening portion 4H of mechanical valve 4F overlaps internal flow path 4E, so that internal flow path 4E is communicated with each other. Mechanical valve 4F is opened and closed in a case where it is in the nozzle operating position, and is always closed in a state other than the nozzle operating position.

As shown in FIG. 3, clamp mechanism 4M for attaching mounting head 46 is provided at a rear side of X-axis moving body 44. Clamp mechanism 4M is configured with leg section bearing section 4N at a lower portion, pusher member 4P, pressing member 4Q at an upper portion, and the like. Leg section bearing section 4N is formed in a V-groove shape that opens upward. Pusher member 4P is provided so as to be movable in the up-down direction, has locking slope 4P1 on the lower side, and has driven slope 4P2 on the upper side. Pressing member 4Q is disposed at an upper position behind pusher member 4P so as to be movable in the front-rear direction. Driving slope 4Q1 formed on a lower portion of the front side of pressing member 4Q contacts driven slope 4P2 of pusher member 4P. In addition, an electric connecting section (not shown) extending rearward is provided at a position above clamp mechanism 4M of X-axis moving body 44.

On the other hand, mounting head 46 has leg section 4R at a lower portion on the front side, and has engagement roller 4S at an upper portion on the front side. A cross section of leg section 4R protrudes downward in a V-shape. A cross section of engagement roller 4S is circular. In addition, connector 461 (refer to FIG. 6 and FIG. 7) is provided on an upper surface of mounting head 46. Connector 461 is connected to the electric connecting section of X-axis moving body 44 to receive power supply and secure a communication path for transmitting and receiving control information.

In the attaching work of mounting head 46, mounting head 46 is first tilted so that leg section 4R engages leg section bearing section 4N. Next, mounting head 46 is erected so that engagement roller 4S enters the front side of pusher member 4P. Next, when pressing member 4Q is driven to the front side, driving slope 4Q1 presses driven slope 4P2 downward, so that pusher member 4P is lowered. As a result, locking slope 4P1 of pusher member 4P locks engagement roller 4S. Finally, the electric connecting section of X-axis moving body 44 and connector 461 of mounting head 46 are connected to complete the attaching work. A detaching work of mounting head 46 is substantially performed in a reverse order of the attaching work.

Figure 4:
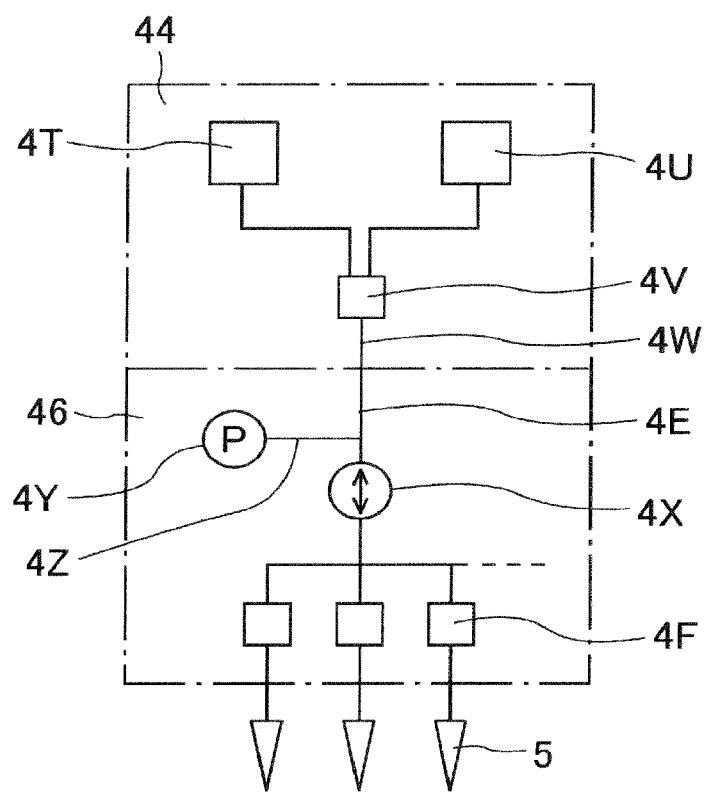
FIG. 4 shows a system configuration of a flow path through which air flows in a component mounter.

In addition, as shown in FIG. 4, X-axis moving body 44 has negative pressure source 4T, positive pressure source 4U, switching valve 4V, and supply pipe path 4W. Negative pressure source 4T supplies the negative pressure air to suction nozzle 5, and is configured by, for example, a vacuum pump that sucks air. Positive pressure source 4U supplies the positive pressure air to suction nozzle 5, and is configured by, for example, a compressor that compresses and delivers air. Switching valve 4V switches the negative pressure and the positive pressure of the air supplied to supply pipe path 4W. Switching valve 4V is configured by, for example, one three-way valve or a combination of multiple on-off valves.

As shown in FIG. 3, supply pipe path 4W opens to a rear face of X-axis moving body 44. On the other hand, internal flow path 4E communicates with the main body of mounting head 46 from rotary tool 47, and opens to the front surface of mounting head 46. When mounting head 46 is attached using clamp mechanism 4M, supply pipe path 4W and internal flow path 4E communicate with each other while maintaining airtightness. As shown in FIG. 4, internal flow path 4E is branched into the number of flow paths equal to the number of suction nozzle 5 on the way, and reaches suction nozzle 5 via mechanical valve 4F.

An internal air sensor is provided on the upstream side of a branching point of internal flow path 4E. The internal air sensor is provided for the purpose of monitoring an abnormality or the like of the flow path system when mounting head 46 is operated. The internal air sensor includes at least one of internal flow sensor 4X and internal pressure sensor 4Y. Internal flow sensor 4X is connected in series in internal flow path 4E. In the present embodiment, internal flow sensor 4X is a bidirectional air flow sensor that detects the flow rate of bidirectional air. Not limited to this, internal flow sensor 4X may be a one-way air flow sensor that detects only the flow rate of one-way air. Internal pressure sensor 4Y is connected to branch flow path 4Z branched from internal flow path 4E to form a blind passage. As internal pressure sensor 4Y, a type capable of measuring both the negative pressure and the positive pressure is employed.

3. Mounting Head Maintenance Device 6 of Embodiment

Figure 5:
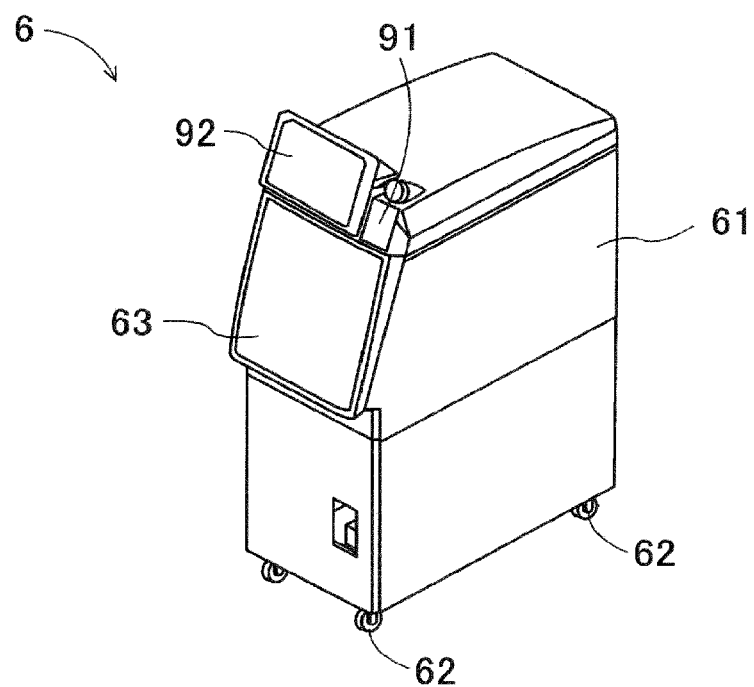
FIG. 5 is a perspective view showing an outer shape of a mounting head maintenance device of an embodiment.

Mounting head maintenance device 6 of the present embodiment will now be described. As shown in FIG. 5, mounting head maintenance device 6 is formed using box-shaped frame 61. Multiple casters 62 are provided at a lower side of frame 61, so that mounting head maintenance device 6 can move. Door 63 is provided at an upper portion of a front surface of frame 61. Door 63 is formed of a transparent resin so that the inside of frame 61 is visually recognized. Mounting head 46 is brought into frame 61 by opening door 63. Operation section 91 and display section 92 are provided at an upper side of door 63.

Figure 6:
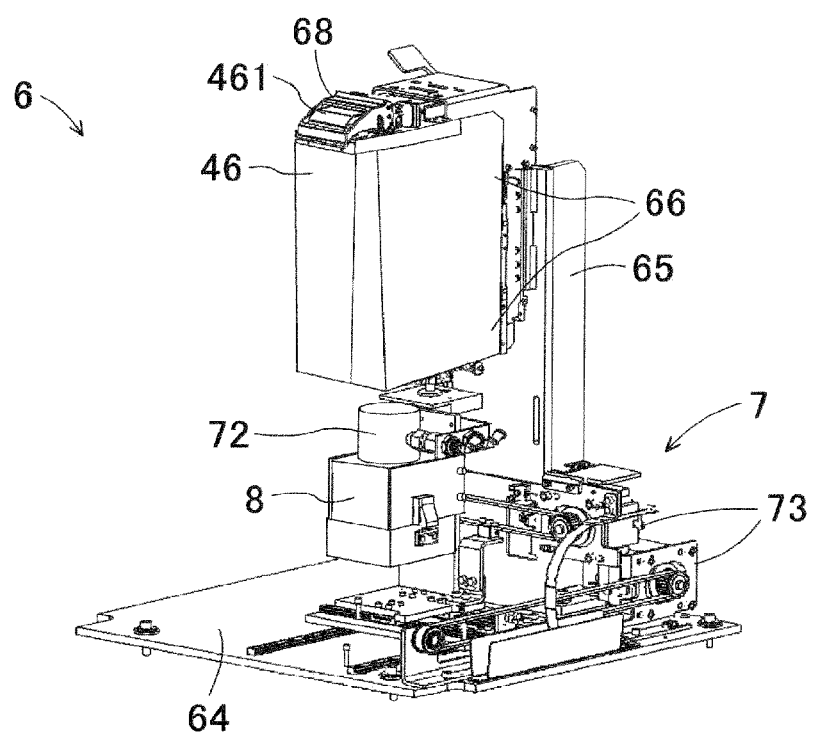
FIG. 6 is a perspective view of an inside of a mounting head maintenance device.

FIG. 6 shows a substantially upper half of a state in which frame 61 is detached from mounting head maintenance device 6. Base 64 is bridged horizontally at substantially an intermediate height inside frame 61. Mounting head maintenance device 6 is configured to include attachment unit 65, inspection unit 7, and control section 9 (refer to FIG. 11).

Figure 7:
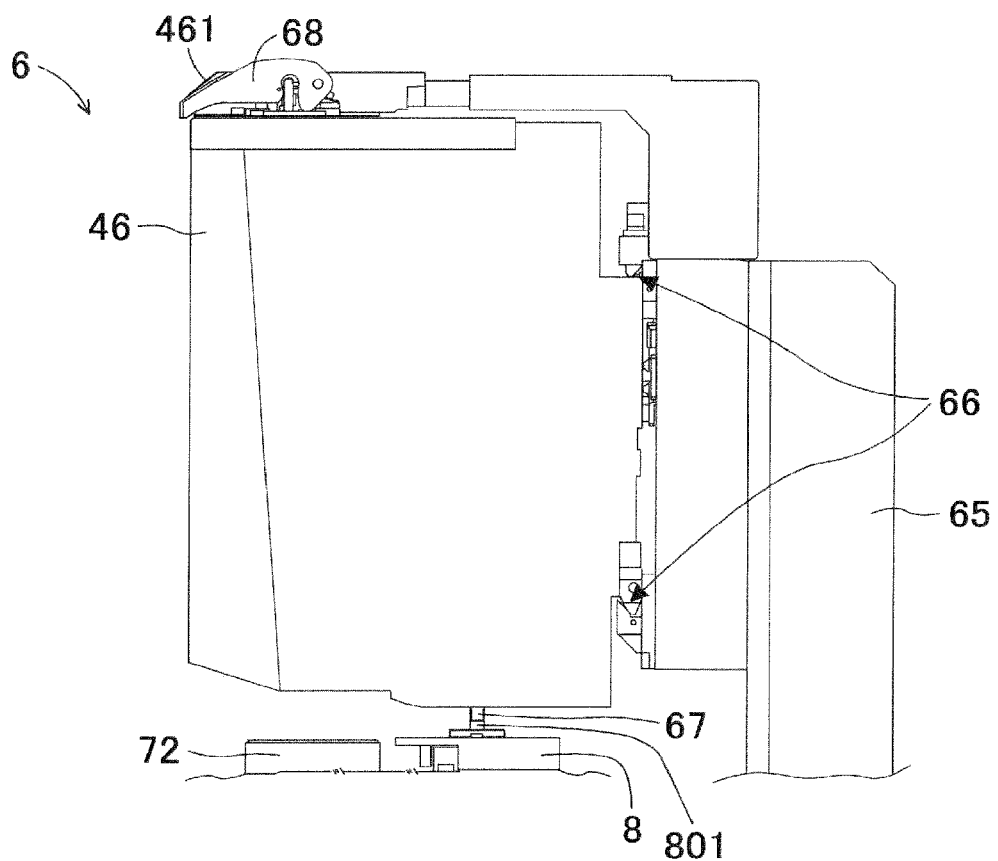
FIG. 7 is a side view showing a state in which measurement is performed in a mounting head maintenance device.

Attachment unit 65 is erected closer to a rear portion of base 64. Clamp mechanism 66 in which clamp mechanism 66 is provided on the front side of attachment unit 65 has the same configuration as clamp mechanism 4M provided on X-axis moving body 44. Accordingly, mounting head 46 is attached to attachment unit 65 in the same manner as the attaching work to X-axis moving body 44. In FIG. 6 and FIG. 7, mounting head 46 is already attached, and electric connecting section 68 on the upper portion of clamp mechanism 66 and connector 461 on the upper surface of mounting head 46 are shown.

Figure 8:
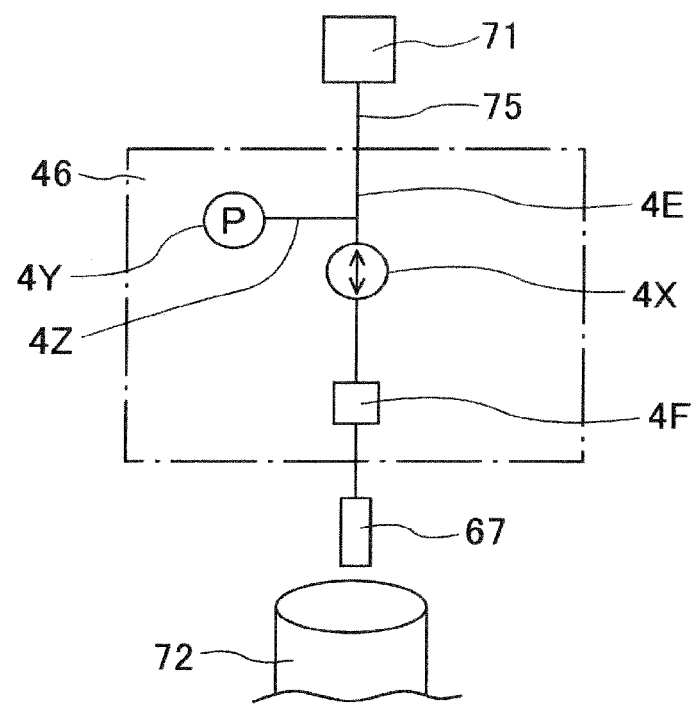
FIG. 8 is a view showing a status in which an internal flow path of a mounting head is cleaned in a mounting head maintenance device.
Figure 9:
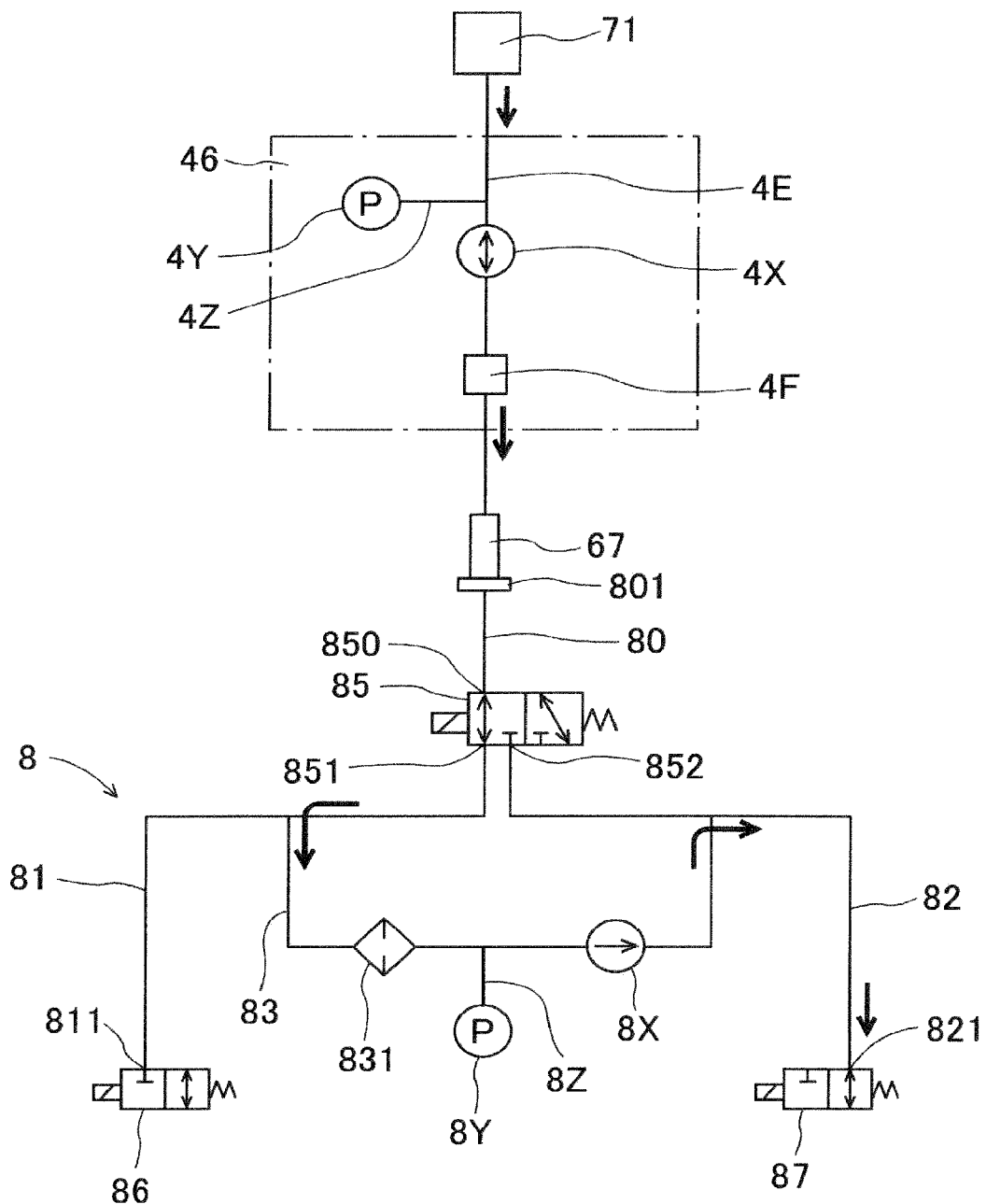
FIG. 9 is a flow path system view showing a status in which measurement is performed by a positive pressure air in a mounting head maintenance device.
Figure 10:
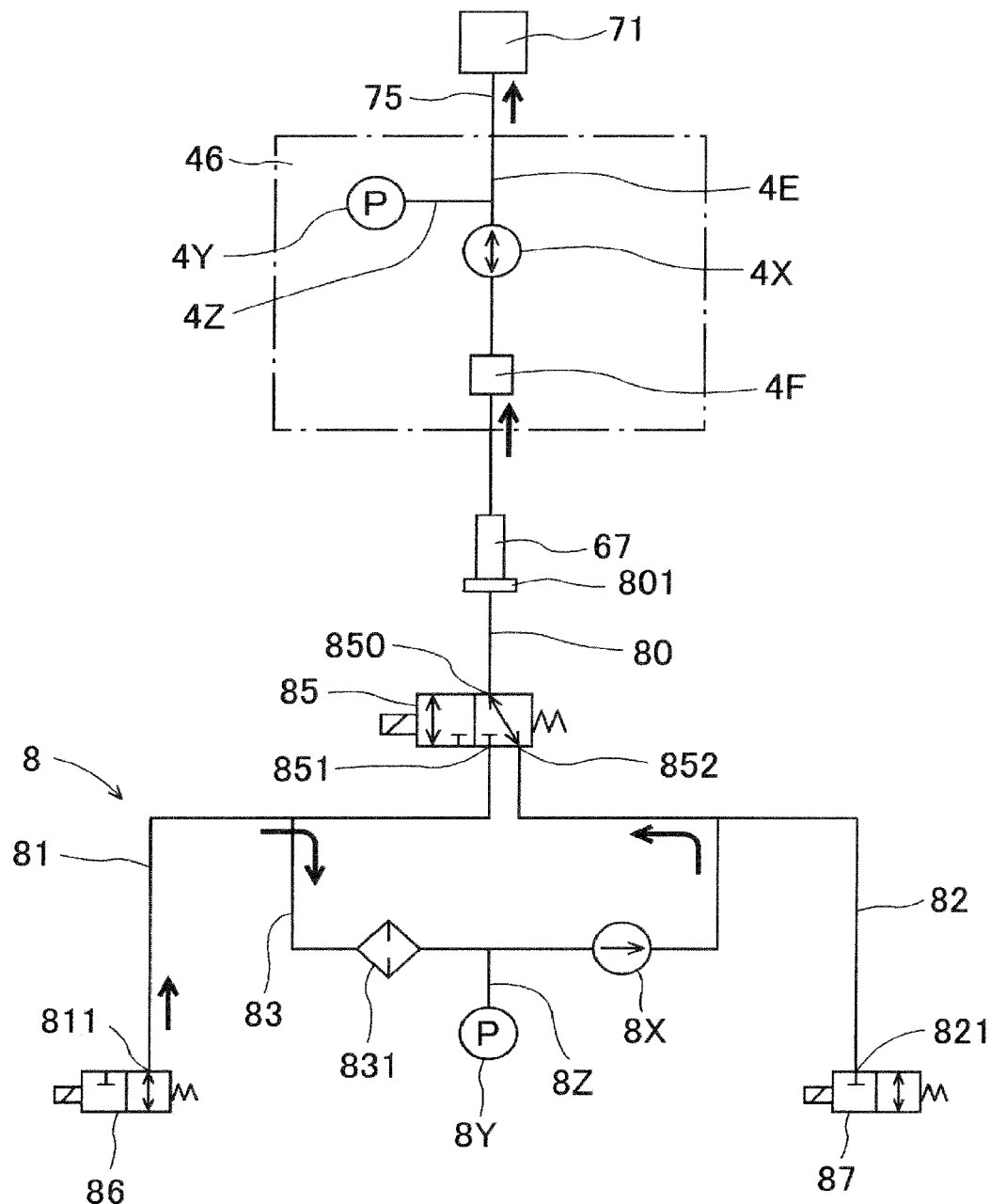
FIG. 10 is a flow path system view showing a status in which measurement is performed by a negative pressure air in a mounting head maintenance device.

Inspection unit 7 has a function of cleaning mounting head 46 in addition to the function of measurement by the internal air sensor and the reference air sensor (described later). Inspection unit 7 is configured with pressure source 71, inspection functional section 8, dirt suction blower 72, X-Y driving mechanism 73, and the like. Pressure source 71 is disposed in attachment unit 65. As shown in FIG. 8 to FIG. 10, pressure source 71 has supply pipe path 75 having the same shape as supply pipe path 4W of X-axis moving body 44. Supply pipe path 75 communicates with internal flow path 4E of mounting head 46 attached to attachment unit 65. In FIG. 8 to FIG. 10, mechanical valve 4F and internal flow path 4E other than the nozzle operating position are not shown.

Pressure source 71 selectively supplies negative pressure air and positive pressure air to internal flow path 4E of mounting head 46. Pressure source 71 generates by switching a negative pressure equivalent to negative pressure source 4T and a positive pressure equivalent to positive pressure source 4U. Further, pressure source 71 also serves as a supply source of cleaning air that cleans a negative pressure flow path range in which at least the negative pressure air flows in internal flow path 4E. Pressure source 71 is configured by, for example, a combination of a vacuum pump, a compressor, and valves. In the present embodiment, entire internal flow path 4E corresponds to the negative pressure flow path range. In addition, a pressure of the cleaning air is set to a purge pressure higher than the positive pressure of positive pressure source 4U.

Inspection functional section 8 is housed in a box body positioned at a lower side of mounting head 46 attached to attachment unit 65. As shown in FIG. 9 and FIG. 10, inspection functional section 8 is configured with the external flow path, the valves, and the reference air sensor. The external flow path is configured by using a resin tube or a metal pipe. The external flow path includes common external flow path 80, first external flow path 81, second external flow path 82, and measurement flow path 83. The valves include switching valve 85, first on-off valve 86, and second on-off valve 87. The valves are electrically controllable electromagnetic valves. The reference air sensor includes reference flow sensor 8X and reference pressure sensor 8Y.

Common external flow path 80 communicates packing 801 provided at the upstream end with common port 850 of switching valve 85. As shown in FIG. 7, packing 801 protrudes at an upper portion of the box body. Packing 801 is set to the same height as board K when viewed from mounting head 46 attached to attachment unit 65. First external flow path 81 communicates first port 851 of switching valve 85 and first on-off valve 86. Second external flow path 82 communicates second port 852 of switching valve 85 and second on-off valve 87. Measurement flow path 83 branches from an intermediate position of first external flow path 81 and joins an intermediate position of second external flow path 82.

Switching valve 85 switches between a first state and a second state described below. In the first state, common port 850 and first port 851 communicate with each other, so that second port 852 is closed (refer to FIG. 9). In the second state, common port 850 and second port 852 communicate with each other, so that first port 851 is closed (refer to FIG. 10). First on-off valve 86 opens and closes downstream end 811 of first external flow path 81. Second on-off valve 87 opens and closes downstream end 821 of second external flow path 82.

The reference air sensor is provided in measurement flow path 83. The reference air sensor needs to be confirmed to have good detection accuracy. Reference flow sensor 8X is connected in series in measurement flow path 83. Reference flow sensor 8X is a one-way air flow sensor configured to detect only the flow rate of the one-way air from first external flow path 81 to second external flow path 82. Reference pressure sensor 8Y is connected to branch flow path 8Z branched from between first external flow path 81 and reference flow sensor 8X, thereby forming the blind passage. As reference pressure sensor 8Y, a type capable of measuring both the negative pressure and the positive pressure is employed. In addition, filter 831 for removing mixed dust is connected in series at a position closer to first external flow path 81 than a branching point of branch flow path 8Z.

In the maintenance of mounting head 46, communicating member 67 is attached to nozzle holding section 4B instead of suction nozzle 5 at the nozzle operating position. Dimensions of communicating member 67 in the up-down direction, the configuration of biasing spring 56, and the like are the same as those of suction nozzle 5. As described above, there are multiple types of opening portion 54 of suction nozzle 5 having different opening areas. The opening area of the opening portion on the lower side of communicating member 67 is set in accordance with the largest opening portion 54. As a result, even when large dust is mixed in internal flow path 4E, it is possible to reliably discharge the dust.

Communicating member 67 held by nozzle holding section 4B communicates with internal flow path 4E, and can be driven to be lifted and lowered from Z-axis motor 48 and monitored by touchdown monitoring sensor 4D. In addition, packing 801 of inspection functional section 8 has a shape compatible with opening portion of communicating member 67. Accordingly, when communicating member 67 is lowered and pressed against packing 801, communicating member 67 and common external flow path 80 communicate with each other while securing airtight.

As shown in FIG. 6 to FIG. 8, dirt suction blower 72 is integrally provided at the upper side of the box body of inspection functional section 8. Dirt suction blower 72 is used to clean internal flow path 4E of mounting head 46. Dirt suction blower 72 is formed in a cylindrical shape opened upward, and includes a fan or the like to have a dust suction function. X-Y driving mechanism 73 is disposed on the front side of attachment unit 65 on an upper surface of base 64. X-Y driving mechanism 73 drives inspection functional section 8 and dirt suction blower 72 in two horizontal directions.

Control section 9 is configured by a computer device having a CPU and operating in software. An installation position of control section 9 is not particularly limited. As shown in the functional block diagram in FIG. 11, control section 9 is assigned with operation section 91 and display section 92 described above. Operation section 91 is configured by an operation switch, a ten-key pad, or the like, and receives an input of an operation command for cleaning or measurement. Display section 92 is configured by a liquid crystal display device or the like, and displays individual information of mounting head 46, a progress status of cleaning and measurement, an execution result, and the like.

Control section 9 includes motor control section 93 and measurement control section 94. Motor control section 93 controls Z-axis motor 48, R-axis motor 4A, Q-axis motor 4C, and stepping motor 4L of mounting head 46. Measurement control section 94 controls pressure source 71, X-Y driving mechanism 73, switching valve 85, first on-off valve 86, and second on-off valve 87.

Measurement control section 94 advances the control according to the software that describes the procedures of the cleaning operation, and the measuring operation by the positive pressure and negative pressure air.

In addition, control section 9 includes three functional sections, that is, detection result acquiring section 95, comparing and determining section 96, and calibration section 97. Detection result acquiring section 95 acquires the internal detection result detected by internal flow sensor 4X and internal pressure sensor 4Y, as well as the reference detection result detected by reference flow sensor 8X and reference pressure sensor 8Y in association with each other.

Here, the internal detection result and the reference detection result are required to be in physical quantities that can be directly compared. Specifically, since the flow of air is not constant over time, an instantaneous value detected may change from moment to moment. In addition, the state of the transient flow of air changes depending on the position of the flow path. Therefore, as the internal detection result and the reference detection result, a value at the same time as those that can be directly compared, a pressure value after the flow of air stops, a time average value of the flow rate, or the like are used.

Comparing and determining section 96 compares the internal detection result and the reference detection result to determine at least one of the accuracy and the availability of internal flow sensor 4X and internal pressure sensor 4Y. Since it is assumed that some air leaks from the flow path system for measurement, it is preferable that comparing and determining section 96 performs determination with a certain allowable value. For example, comparing and determining section 96 calculates a measurement error represented by a difference between internal detection result and reference detection result, and displays the measurement error on display section 92. Further, for example, comparing and determining section 96 compares the measurement error with a maximum allowable error set in advance to determine the availability, and displays the determination result on display section 92.

Calibration section 97 calibrates internal flow sensor 4X and internal pressure sensor 4Y based on the determination result of comparing and determining section 96. For example, calibration section 97 displays an adjustment method of an output adjusting function applied to internal flow sensor 4X and internal pressure sensor 4Y on display section 92. Further, for example, calibration section 97 displays an updated value of a conversion coefficient used when converting electric outputs of internal flow sensor 4X and internal pressure sensor 4Y into physical quantities on display section 92.

4. Maintenance Operation Using Mounting Head Maintenance Device 6

Next, an operation of performing maintenance of mounting head 46 using mounting head maintenance device 6 will be described. In the maintenance, first, internal flow path 4E of mounting head 46 is cleaned, and then measurement and inspection by the internal air sensor and the reference air sensor are performed. The operation flow shown in FIG. 12 is advanced by a joint operation between an operator and mounting head maintenance device 6.

Figure 12:
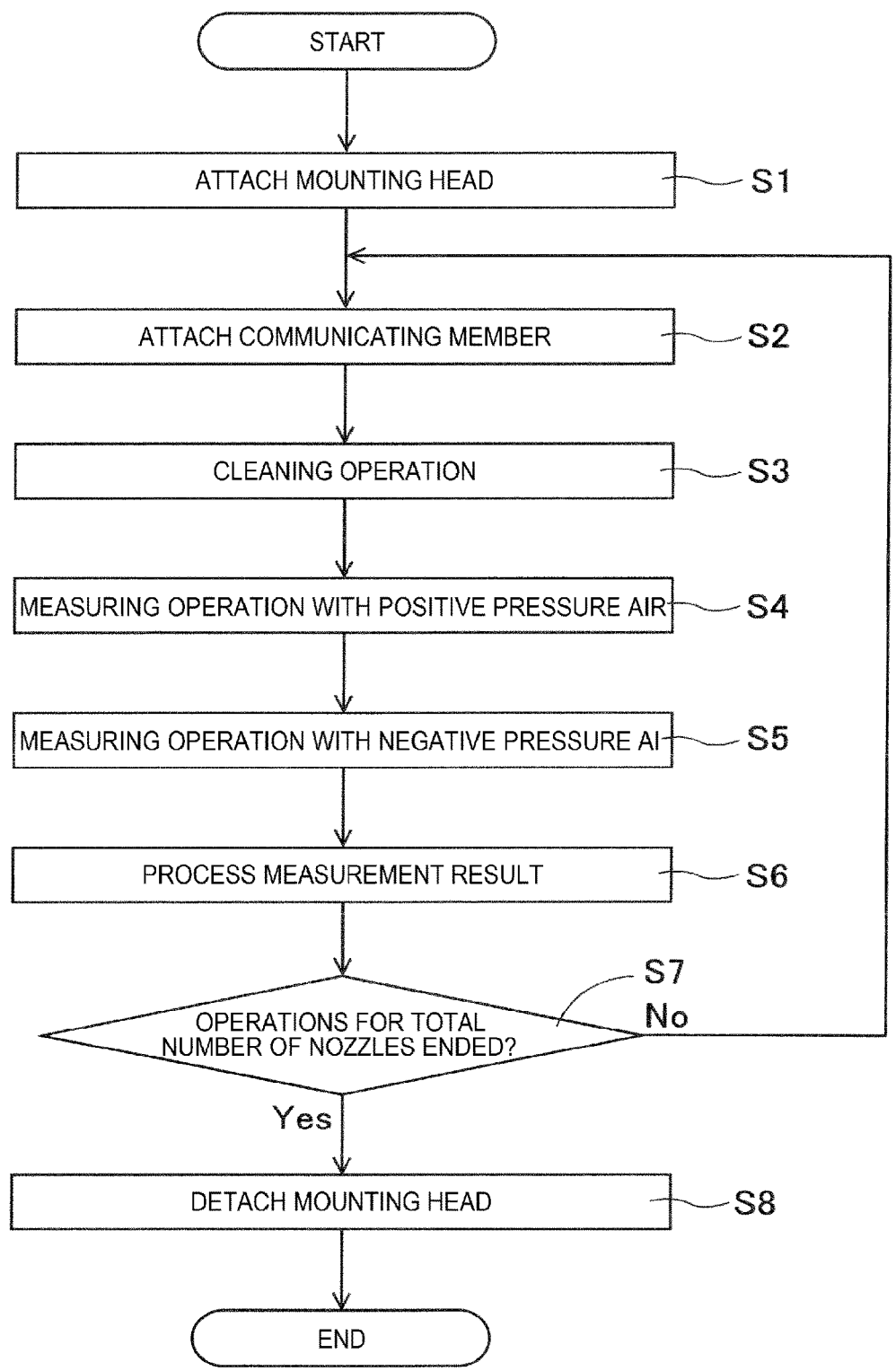
FIG. 12 is a view showing an operation flow when a mounting head is maintained using a mounting head maintenance device.

In step S1 in FIG. 12, the operator opens door 63 of mounting head maintenance device 6, and attaches mounting head 46 to attachment unit 65. By connecting electric connecting section 68 and connector 461, power supply to mounting head 46 is secured, and mounting head 46 can be controlled from control section 9. In the next step S2, the operator detaches suction nozzle 5 in the nozzle operating position of mounting head 46, and attaches communicating member 67.

In the next step S3, the operator closes door 63 and inputs an operation command from operation section 91. The operation command is a command for continuously performing a cleaning operation, a measuring operation with positive pressure air, and a measuring operation with negative pressure air. Without being limited to this, individual commands may be set for three operations, and any one operation may be performed. Control section 9 that has recognized the operation command activates measurement control section 94. First, measurement control section 94 controls the cleaning operation.

Specifically, measurement control section 94 controls X-Y driving mechanism 73 to move dirt suction blower 72 directly below communicating member 67, so that the status shown in FIG. 8 is assumed. Next, measurement control section 94 controls stepping motor 4L via motor control section 93 to open mechanical valve 4F so as to communicate internal flow path 4E. Next, measurement control section 94 controls pressure source 71 to supply cleaning air having a purge pressure. As a result of this control, the cleaning air passes from pressure source 71 through internal flow path 4E and communicating member 67, and is exhausted toward dirt suction blower 72. Accordingly, the dust mixed in internal flow path 4E moves by the flow of the cleaning air and is discharged to dirt suction blower 72.

In the next step S4, measurement control section 94 secondly controls the measuring operation with the positive pressure air. Specifically, measurement control section 94 controls X-Y driving mechanism 73 to move inspection functional section 8 directly below communicating member 67. In addition, measurement control section 94 controls Z-axis motor 48 via motor control section 93 to lower communicating member 67 so as to press communicating member 67 against packing 801. As a result, the flow path system for measurement shown in FIG. 9 and FIG. 10 is formed.

Next, measurement control section 94 controls switching valve 85 to be in the first state, first on-off valve 86 to be in the closed state, and second on-off valve 87 to be in the open state, so that pressure source 71 is controlled to be the positive pressure of positive pressure source 4U. Then, the positive pressure air flows in the direction of the thick-line arrow shown in FIG. 9, so that measurement by reference flow sensor 8X is enabled. When a first predetermined time elapses from the control of pressure source 71, the flow of the positive pressure air is stabilized, so that measurement control section 94 sends a flow rate detecting command to detection result acquiring section 95. Detection result acquiring section 95 sets the same measurement time width for internal flow sensor 4X and reference flow sensor 8X, and acquires a time average value of the flow rate of the positive pressure air in the measurement time width.

Next, measurement control section 94 performs control for closing second on-off valve 87. As a result, the flow path system for measurement does not have an inlet and outlet port, so that the measurement of a static positive pressure by internal pressure sensor 4Y and reference pressure sensor 8Y is enabled. When a second predetermined time elapses after second on-off valve 87 is closed, the flow of the positive pressure air stops and the static pressure is stabilized, so that measurement control section 94 sends a pressure detecting command to detection result acquiring section 95. Detection result acquiring section 95 acquires the positive pressure value detected by each of internal pressure sensor 4Y and reference pressure sensor 8Y.

In the next step S5, measurement control section 94 thirdly controls the measuring operation with the negative pressure air. Specifically, measurement control section 94 controls switching valve 85 to be in the second state, first on-off valve 86 to be in the open state, and second on-off valve 87 to be in the closed state, so that pressure source 71 is controlled to be the negative pressure of negative pressure source 4T. Then, the negative pressure air flows in the direction of the thick-line arrow shown in FIG. 10, so that measurement by reference flow sensor 8X is enabled.

When a third predetermined time elapses from the control of pressure source 71, the flow of the negative pressure air is stabilized, so that measurement control section 94 sends a flow rate detecting command to detection result acquiring section 95. Detection result acquiring section 95 sets the same measurement time width for internal flow sensor 4X and reference flow sensor 8X, and acquires a time average value of the flow rate of the negative pressure air in the measurement time width. In a case where internal flow sensor 4X is a one-way air flow sensor, the time average value of the flow rate is acquired with only the meaningful one of the positive pressure air and the negative pressure air.

Next, measurement control section 94 performs control for closing first on-off valve 86. As a result, the flow path system for measurement does not have an inlet and outlet port, so that the measurement of a static negative pressure by internal pressure sensor 4Y and reference pressure sensor 8Y is enabled. When a fourth predetermined time elapses after first on-off valve 86 is closed, the flow of the negative pressure air stops and the static pressure is stabilized, so that measurement control section 94 sends a pressure detecting command to detection result acquiring section 95. Detection result acquiring section 95 acquires the negative pressure value detected by each of internal pressure sensor 4Y and reference pressure sensor 8Y. The first to fourth predetermined times may be different from or equal to each other.

In the next step S6, comparing and determining section 96 and calibration section 97 process the measurement result to generate an inspection result, and display the inspection result on display section 92. Comparing and determining section 96 and calibration section 97 may collectively process multiple measurement results corresponding to multiple suction nozzles 5, or may collectively display multiple inspection results on display section 92. Thereafter, the operator detaches communicating member 67 to attach suction nozzle 5. As a result, the maintenance of internal flow path 4E corresponding to one suction nozzle 5 is ended.

In the next step S7, it is determined whether the maintenance corresponding to the total number of suction nozzles 5 is ended. In a case where the maintenance is not ended, measurement control section 94 controls R-axis motor 4A via motor control section 93 to rotate rotary tool 47. As a result, internal flow path 4E corresponding to next suction nozzle 5 becomes a target of the maintenance. Then, the execution of the operation flow is returned to step S2.

In a case where the maintenance corresponding to the operations of the total number of suction nozzles 5 is ended in step S7, the execution of the operation flow proceeds to step S8. In step S8, the operator opens door 63, detaches mounting head 46 from attachment unit 65, and removes mounting head 46 from the device. Thus, the maintenance for one mounting head 46 is ended.

In mounting head maintenance device 6 of the embodiment, detection result acquiring section 95 acquires the internal detection result of the internal air sensors (4X and 4Y) of mounting head 46 and the reference detection result of the reference air sensors (8X and 8Y) provided outside mounting head 46 in association with each other. Accordingly, by comparing the two detection results, it is possible to calibrate the internal air sensors (4X and 4Y). That is, in a case where the two detection results coincide with each other, it is guaranteed that the detection accuracy of the internal air sensor (4X and 4Y) is correct. In addition, in a case where the two detection results do not coincide with each other, calibration section 97 can perform the calibration of the internal air sensors (4X and 4Y) to recover the detection accuracy.

In addition, since the one-way air flow sensor is used as reference flow sensor 8X, it is necessary to use switching valve 85 for switching a direction in which the air flows at the positive pressure and the negative pressure. Nevertheless, the cost of mounting head maintenance device 6 is reduced in comparison with a configuration in which a special and expensive bidirectional air flow sensor is used for reference flow sensor 8X.

5. Application and Modification of Embodiment

Even in a case where mounting head 46 does not include rotary tool 47 but includes only one suction nozzle 5, mounting head maintenance device 6 can be used. In addition, internal flow path 4E of mounting head 46 may be divided into a negative pressure flow path range and a positive pressure flow path range, in this aspect, the cleaning air flows through at least the negative pressure flow path range of internal flow path 4E. In addition, when the cleaning operation is not performed, communicating member 67 may not be used, and a tube may be used to connect opening portion 54 of suction nozzle 5 and packing 801 of inspection functional section 8.

Further, in a case where there are multiple communicating members 67, all of suction nozzles 5 may be replaced with communicating member 67 at the beginning of the operation flow. In this case, the cleaning operation and the measuring operation, and the rotation of rotary tool 47 are alternately repeated. In addition, inspection functional section 8 can be deformed to be connected between pressure source 71 and mounting head 46. In this aspect, communicating member 67 uses two types, an opening type and a closing type.

In addition, only one of internal flow sensor 4X and internal pressure sensor 4Y can be used to monitor internal flow path 4E of mounting head 46, and the other can be omitted. In this aspect, one of corresponding reference flow sensor 8X and reference pressure sensor 8Y is not required. In addition, the flow path system of inspection functional section 8 is simplified.

Furthermore, comparing and determining section 96 and calibration section 97 may be omitted. In this aspect, detection result acquiring section 95 displays the internal detection result and the reference detection result on display section 92, or outputs them in another manner. As a result, comparison and determination in the human system, as well as calibration in the human system of internal flow sensor 4X and internal pressure sensor 4Y are enabled. The present embodiment can be applied and modified in other various forms.

REFERENCE SIGNS LIST

1: Component mounter, 44: X-axis moving body, 46: Mounting head, 47: Rotary tool, 4B: Nozzle holding section, 4D: Touchdown monitoring sensor, 4E: Internal flow path, 4F: Mechanical valve, 4M: Clamp mechanism, 4T: Negative pressure source, 4U: Positive pressure source, 4X: Internal flow sensor, 4Y: Internal pressure sensor, 5: Suction nozzle, 6: Mounting head maintenance device, 66: Clamp mechanism, 67: Communicating member, 7: Inspection unit, 71: Pressure source, 72: Dirt suction blower, 73: X-Y driving mechanism, 8: Inspection functional section, 80: Common external flow path, 81: First external flow path, 82: Second external flow path, 83: Measurement flow path, 85: Switching valve, 86: First on-off valve, 87: Second on-off valve, 8X: Reference flow sensor, 8Y: Reference pressure sensor, 9: Control section, 93: Motor control section, 94: Measurement control section, 95: Detection result acquiring section, 96: Comparing and determining section, 97: Calibration section

The invention claimed is:

1. A mounting head maintenance device comprising:
   an external flow path configured to communicate with an internal flow path of a mounting head, the mounting head having a nozzle holding section that detachably holds a suction nozzle, the internal flow path that selectively supplies negative pressure air and positive pressure air to the suction nozzle, and an internal air sensor that is provided in the internal flow path and detects at least one of a flow rate and pressure of the air;
   a reference air sensor provided in the external flow path and configured to detect at least one of the flow rate and the pressure of the air;
   a detection result acquiring section configured to acquire an internal detection result of the internal air sensor and a reference detection result of the reference air sensor; and a comparing and determining section configured to compare the internal detection result with the reference detection result to determine at least one of accuracy and availability of the internal air sensor.

2. The mounting head maintenance device according to claim 1, further comprising:
   a calibration section configured to calibrate the internal air sensor based on a determination result of the comparing and determining section.

3. The mounting head maintenance device according to claim 1, wherein
   one end of the external flow path is held by the nozzle holding section instead of the suction nozzle.

4. The mounting head maintenance device according to claim 3, wherein
   the internal air sensor includes an internal flow sensor that detects the flow rate of the air and an internal pressure sensor that detects the pressure of the air,
   the external flow path has an on-off valve at the other end thereof, and
   the reference air sensor includes a reference flow sensor that detects the flow rate of the air in a state in which the on-off valve is open, and a reference pressure sensor that detects the pressure of the air in a state in which the on-off valve is closed.

5. The mounting head maintenance device according to claim 1, further comprising:
a pressure source configured to selectively supply the negative pressure air and positive pressure air to the internal flow path of the mounting head.

6. The mounting head maintenance device according to claim 5, wherein
the pressure source also serves as a supply source of positive pressure cleaning air that cleans a negative pressure flow path range in which at least the negative pressure air flows in the internal flow path, and
the internal air sensor and the reference air sensor perform a detection after the negative pressure flow path range is cleaned.

* * * * *